United States Patent
Fujita

(10) Patent No.: US 12,543,587 B2
(45) Date of Patent: Feb. 3, 2026

(54) MULTI-LAYERED BOARD, SEMICONDUCTOR PACKAGE, AND METHOD OF MANUFACTURING SEMICONDUCTOR PACKAGE

(71) Applicant: SHANGHAI TIANMA MICRO-ELECTRONICS CO., LTD., Shanghai (CN)

(72) Inventor: Akira Fujita, Kanagawa (JP)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 688 days.

(21) Appl. No.: 17/712,549

(22) Filed: Apr. 4, 2022

(65) Prior Publication Data

US 2022/0328390 A1   Oct. 13, 2022

(30) Foreign Application Priority Data

Apr. 8, 2021   (JP) ................. 2021-065768

(51) Int. Cl.
*H01L 23/498*   (2006.01)
*H01L 23/00*   (2006.01)

(52) U.S. Cl.
CPC .. *H01L 23/49822* (2013.01); *H01L 23/49838* (2013.01); *H01L 24/16* (2013.01);
(Continued)

(58) Field of Classification Search
None
See application file for complete search history.

(56) References Cited

U.S. PATENT DOCUMENTS

2008/0230903 A1   9/2008   Sato
2010/0140800 A1   6/2010   Hagihara
(Continued)

FOREIGN PATENT DOCUMENTS

JP   H09181208 A   7/1997
JP   H9-307022   11/1997
(Continued)

OTHER PUBLICATIONS

Office Action, issued in Japanese Patent Application No. 2021-065768 dated Nov. 26, 2024. (concise explanation of the relevance).

*Primary Examiner* — Hung K Vu
(74) *Attorney, Agent, or Firm* — NIXON & VANDERHYE

(57) ABSTRACT

A multi-layered board includes an upper insulating layer, a lower conductive layer including first lower conductive parts, an upper conductive layer between the lower conductive layer and the upper insulating layer and including first upper conductive parts and second upper conductive parts, and a lower insulating layer between the lower conductive layer and the upper conductive layer. The first upper conductive part includes a first pad exposed from a hole of the upper insulating layer. The second upper conductive part includes a second pad exposed from a hole of the upper insulating layer. At least a part of the first pad is in direct contact with the first lower conductive part within a hole of the lower insulating layer. The second pad is outside any hole of the lower insulating layer. A top surface of the second pad is higher than a top surface of the first pad.

8 Claims, 17 Drawing Sheets

(52) U.S. Cl.
CPC .... *H01L 24/81* (2013.01); *H01L 2224/16227* (2013.01); *H01L 2224/81143* (2013.01); *H01L 2224/81815* (2013.01); *H01L 2924/15174* (2013.01)

(56) References Cited

U.S. PATENT DOCUMENTS

| | | | |
|---|---|---|---|
| 2016/0197057 A1* | 7/2016 | Umemoto | H01L 24/97 257/738 |
| 2021/0082783 A1* | 3/2021 | Kim | H01L 23/3677 |
| 2023/0133567 A1* | 5/2023 | Jung | H01L 24/73 257/738 |

FOREIGN PATENT DOCUMENTS

| | | |
|---|---|---|
| JP | H10189821 A | 7/1998 |
| JP | 2008235666 A | 10/2008 |
| JP | 2009260255 A | 11/2009 |

* cited by examiner

MULTI-LAYERED BOARD, SEMICONDUCTOR PACKAGE, AND METHOD OF MANUFACTURING SEMICONDUCTOR PACKAGE

CROSS-REFERENCE TO RELATED APPLICATIONS

This non-provisional application claims priority under 35 U.S.C. § 119(a) on Patent Application No. 2021-065768 filed in Japan on Apr. 8, 2021, the entire content of which is hereby incorporated by reference.

BACKGROUND

This disclosure relates to a multi-layered board, a semiconductor package, and a method of manufacturing the semiconductor package.

In recent flip-chip bonding for a semiconductor package, the number of bumps has been increased so that the bumps are disposed all over a surface side of the chip (which is also referred to as area bump) and the pitch of the bumps has been narrowed as miniaturization and multi-functionalization of chips are progressed.

However, the small bump pitch of a chip makes it difficult to mount the chip directly onto the main board of a printed circuit board base. For this reason, fan-out structured packages have been developed to perform scale conversion between a chip and a main board or to incorporate a plurality of chips having different functions into one package.

The fan-out structure is a means to attain a system in package (SiP); it uses a redistribution layer (RDL) that enables multi-layered fine wiring as an intermediate layer to spread the wiring to the outside of the chips.

Flip-chip bonding for a fan-out package usually uses soldering. The multi-layered fine wiring is fanned out in the redistribution layer from the pads to be connected with the bumps on the chip. This structure converts the scale of the bonding pitch so that the chip can be connected to the main board.

It is known that reflow soldering has an effect of self-alignment of a solder bump with a pad. This self-alignment effect is induced by the surface tension of the molten solder. Even if a chip (solder bump) is misaligned, the position is automatically corrected by the self-alignment effect as far as the deviation of the bump from the pad is in a tolerable range. As a result, the pad and the bump bond together more accurately than when the chip is placed.

JP H9-307022 A discloses a technique for flip-chip bonding with solder bumps that utilizes the self-alignment effect of solder to achieve accurate chip bonding. Specifically, this technique provides bumps on four pads located at the corners of the area of a printed circuit board where to place a semiconductor package. These four pads are thicker than the other pads.

According to JP H9-307022 A, a semiconductor package is placed on the pads with the bumps at the corners. Because of the self-alignment effect, those bumps absorb the load caused by the difference in thermal expansion between the printed circuit board and the package during the reflow process. As a result, the reliability of soldering at the other pads increases.

SUMMARY

An aspect of this disclosure is a multi-layered board with a redistribution layer to mount a chip thereon by flip-chip bonding. The multi-layered board includes: an upper insulating layer; a lower conductive layer located lower than the upper insulating layer and including a plurality of first lower conductive parts; an upper conductive layer located between the lower conductive layer and the upper insulating layer and including a plurality of first upper conductive parts and a plurality of second upper conductive parts; and a lower insulating layer located between the lower conductive layer and the upper conductive layer. Each of the plurality of first upper conductive parts includes a first pad exposed from a hole of the upper insulating layer. Each of the plurality of second upper conductive parts includes a second pad exposed from a hole of the upper insulating layer. At least a part of the first pad is in direct contact with a first lower conductive part within a hole of the lower insulating layer. The second pad is located outside any hole of the lower insulating layer. A top surface of the second pad is located higher than a top surface of the first pad.

An aspect of this disclosure is a method of manufacturing a semiconductor package. The method includes: manufacturing a multi-layered board including a plurality of first pads and a plurality of second pads; preparing a chip including a plurality of first solder bumps and a plurality of second solder bumps; reflowing the plurality of second solder bumps in a state where the plurality of second solder bumps are in contact with the plurality of second pads; reflowing the plurality of first solder bumps in a state where the plurality of first solder bumps are in contact with the plurality of first pads after reflowing the plurality of second solder bumps; bonding the plurality of first solder bumps with the plurality of first pads; and bonding the plurality of second solder bumps with the plurality of second pads. The manufacturing the multi-layered board includes: producing a lower conductive layer; producing a lower insulating layer above the lower conductive layer; producing an upper conductive layer above the lower insulating layer; and producing an upper insulating layer above the upper conductive layer. The lower conductive layer includes a plurality of first lower conductive parts. The upper conductive layer includes a plurality of first upper conductive parts and a plurality of second upper conductive parts. Each of the plurality of first upper conductive parts includes a first pad exposed from a hole of the upper insulating layer. Each of the plurality of second upper conductive parts includes a second pad exposed from a hole of the upper insulating layer. At least a part of the first pad is in direct contact with a first lower conductive part within a hole of the lower insulating layer. The second pad is located outside any hole of the lower insulating layer. A top surface of the second pad is located higher than a top surface of the first pad.

It is to be understood that both the foregoing general description and the following detailed description are exemplary and explanatory and are not restrictive of this disclosure.

EMBODIMENTS

Figure 1A:
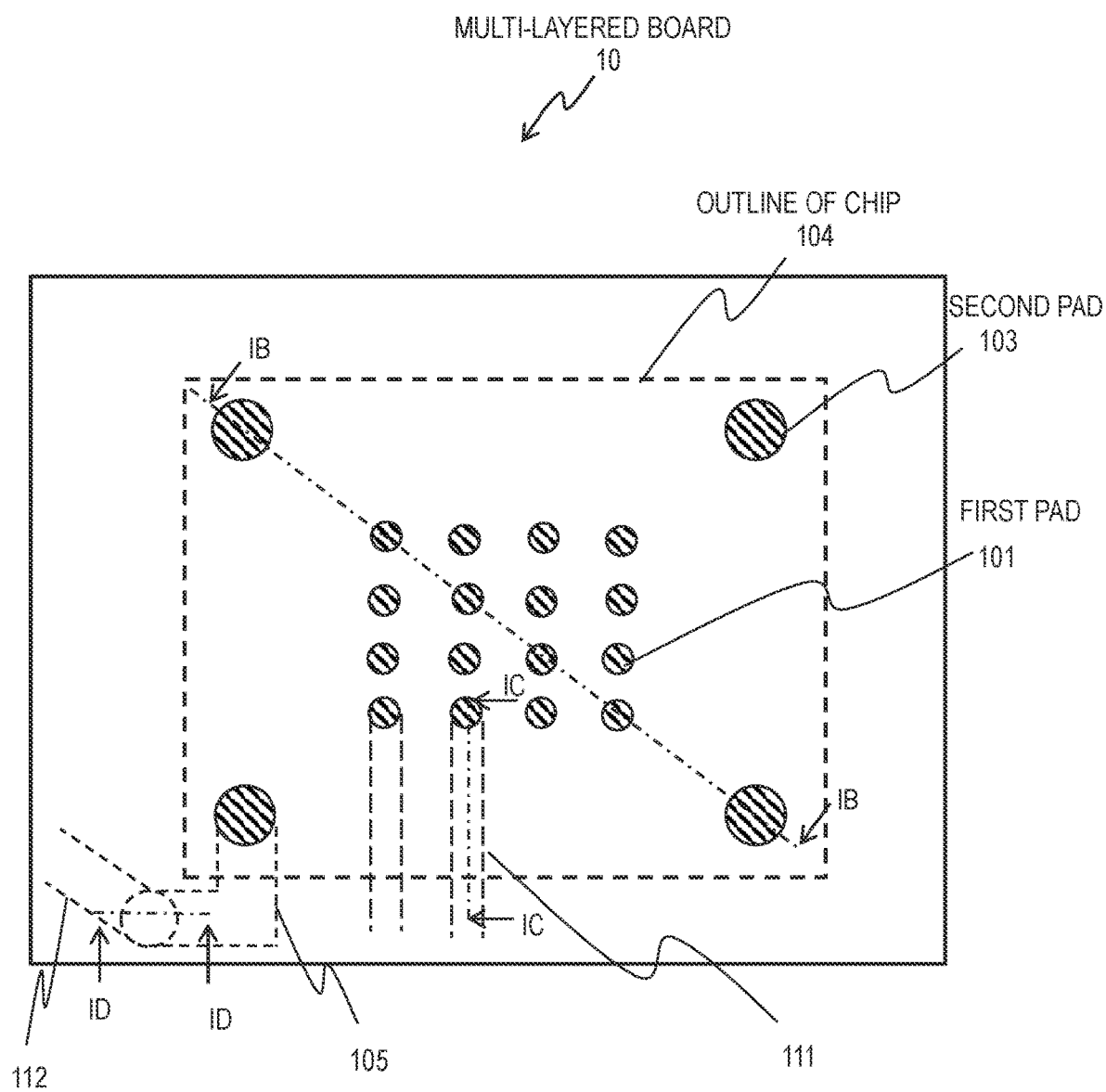
FIG. 1A is a plan diagram schematically illustrating a configuration example of a multi-layered board in an embodiment of this specification.

Hereinafter, embodiments of this disclosure are described with reference to the accompanying drawings. It should be noted that the embodiments are merely examples to implement this disclosure and are not to limit the technical scope of this disclosure. Some elements in the drawings are exaggerated in size or shape for clear understanding of the description.

Overview

Disclosed herein is a multi-layered board for bonding a semiconductor chip (also simply referred to as chip) thereon. Pads on the multi-layered board and solder bumps on the chip are bonded together by reflow soldering. Reflow soldering has an effect of self-alignment of solder bumps to the pads caused by the surface tension of the molten solder. Even if the chip is misaligned with respect to the multi-layered board, the position of the chip can be automatically corrected by the self-alignment effect as far as the deviation of the bumps from the pads is in a tolerable range. As a result, the pads and the bumps bond together more accurately than when the chip is initially placed.

To make the self-alignment work more effectively, the multi-layered board disclosed herein includes first pads and second pads different in the height of the top surface. The top surfaces of the second pads are located higher than the top surfaces of the first pads.

More specifically, the multi-layered board includes a lower insulating layer and an upper insulating layer; the first pads and the second pads are located between the upper insulating layer and the lower insulating layer and exposed from holes of the upper insulating layer. Each first pad, at least a part of it, is in direct contact with a lower conductive part in a hole of the lower insulating layer. The second pads are located outside any hole of the lower insulating layer. The top surfaces of the second pads are located higher than the top surfaces of the first pads.

The solder bumps of the chip placed on the second pads melt first. Their surface tensions induce the self-alignment function to automatically correct the position of the chip with respect to the multi-layered board. Subsequently, the solder bumps of the chip placed on the first pads also melt to perform automatic slight realignment. Thereafter, the solder bumps solidify to complete soldering of the pads and the bumps.

Structure of Multi-Layered Board

FIG. 1A is a plan diagram schematically illustrating a configuration example of a multi-layered board in an embodiment of this specification. The multi-layered board 10 includes a redistribution layer of a fan-out structure to perform scale conversion between a semiconductor chip and a main board or incorporate a plurality of chips having different functions into one package. Accordingly, the pitch of the pads on the opposite side to the side for bonding semiconductor chips is larger than the pitch of the pads on the side for bonding semiconductor chips.

The fan-out structure is a means to attain a system in package (SiP). It uses a redistribution layer (RDL) that enables multi-layered fine wiring as an intermediate layer to spread the wiring to the outside of the chips.

The multi-layered board 10 includes a redistribution layer (RDL) composed of a plurality of conductive layers and a plurality of insulating layers. Each conductive layer is sandwiched between insulating layers. Although the multi-layered board 10 in the configuration example of FIG. 1A has a rectangular shape, the multi-layered board 10 can have a desirable shape.

FIG. 1A illustrates the top face of the multi-layered board 10; a semiconductor chip including a bump array (not shown in FIG. 1A) is mounted on this top face by flip chip. A semiconductor package includes the multi-layered board 10 and a semiconductor chip mounted on the multi-layered board 10. Typically, the semiconductor chip and the multi-layered board 10 are packaged with mold resin.

The multi-layered board 10 includes a plurality of pads to be soldered to the bumps on a semiconductor chip. The multi-layered board 10 in the configuration example of FIG.

1A includes a plurality of second pads 103 and a plurality of first pads 101. FIG. 1A includes four second pads 103 and one of them is provided with a reference sign 103 by way of example. Further, FIG. 1A includes sixteen first pads 101 and one of them is provided with a reference sign 101 by way of example. The rectangle 104 in a dashed line represents the outline of the semiconductor chip to be mounted. The pads 101 and 103 are located inner than the outline 104.

The pads 101 and 103 are exposed from the surface of an insulating layer. The material for the pads 101 and 103 can be selected desirably; for example, copper covered with gold can be used. The material for the insulating layer can also be selected desirably; typically, polyimide is used. Although the pads 101 and 103 in the configuration example of FIG. 1A have circular shapes, they can have other shapes.

In the array of the second pads 103 and the first pads 101, the second pads 103 are disposed outermost (on the outer end). There is no pad located outer than an outermost second pad along a virtual line connecting the centroid of the array and the centroid of the second pad. In the configuration example of FIG. 1A, each distance from the centroid of the array of the second pads 103 and the first pads 101 to the centroid of a second pad 103 is longer than the distance from the centroid of the array to the centroid of any one of the first pads 101. This configuration enables effective self-alignment of the chip during the reflow process of the solder bumps on the chip. The reflow of solder bumps will be described later. The distance from the centroid of the array to the centroid of a second pad 103 can be equal to the longest distance to a first pad 101.

The second pads 103 in the configuration example of FIG. 1A are disposed symmetrically about a point. This disposition enables effective self-alignment of the chip during the reflow process of the solder bumps on the chip. Although the configuration example of FIG. 1A includes four second pads 103, the number of second pads can be selected desirably. For example, the multi-layered board 10 can include two, three, or five or more second pads. For example, two second pads can be disposed diagonally or four second pads can be disposed at four corners of the first pad region.

In the configuration example of FIG. 1A, the second pads 103 have an area larger than the first pads 101. This configuration achieves effective self-alignment of the chip during the reflow process of the solder bumps on the chip. The pads can have desirable shapes. The smallest distance between two intersections of a virtual line passing through the centroid of a second pad and the outer end of the second pad is longer than the corresponding distance of a first pad. The second pad 103 can have a planar shape different from the planar shape of the first pad 101.

In the configuration example of FIG. 1A, each first pad 101 is connected with a lower conductive part 111 (indicated by a dashed line) under the uppermost insulating layer. Each second pad 103 is a part of a conductive part 105. The other part of the conductive part 105 indicated by a dashed line is located under the uppermost insulating layer. The conductive part 105 is connected with a lower conductive part 112. The lower conductive part 112 is a conductive part located under the uppermost insulating layer and is indicated by a dashed line.

Figure 1B:
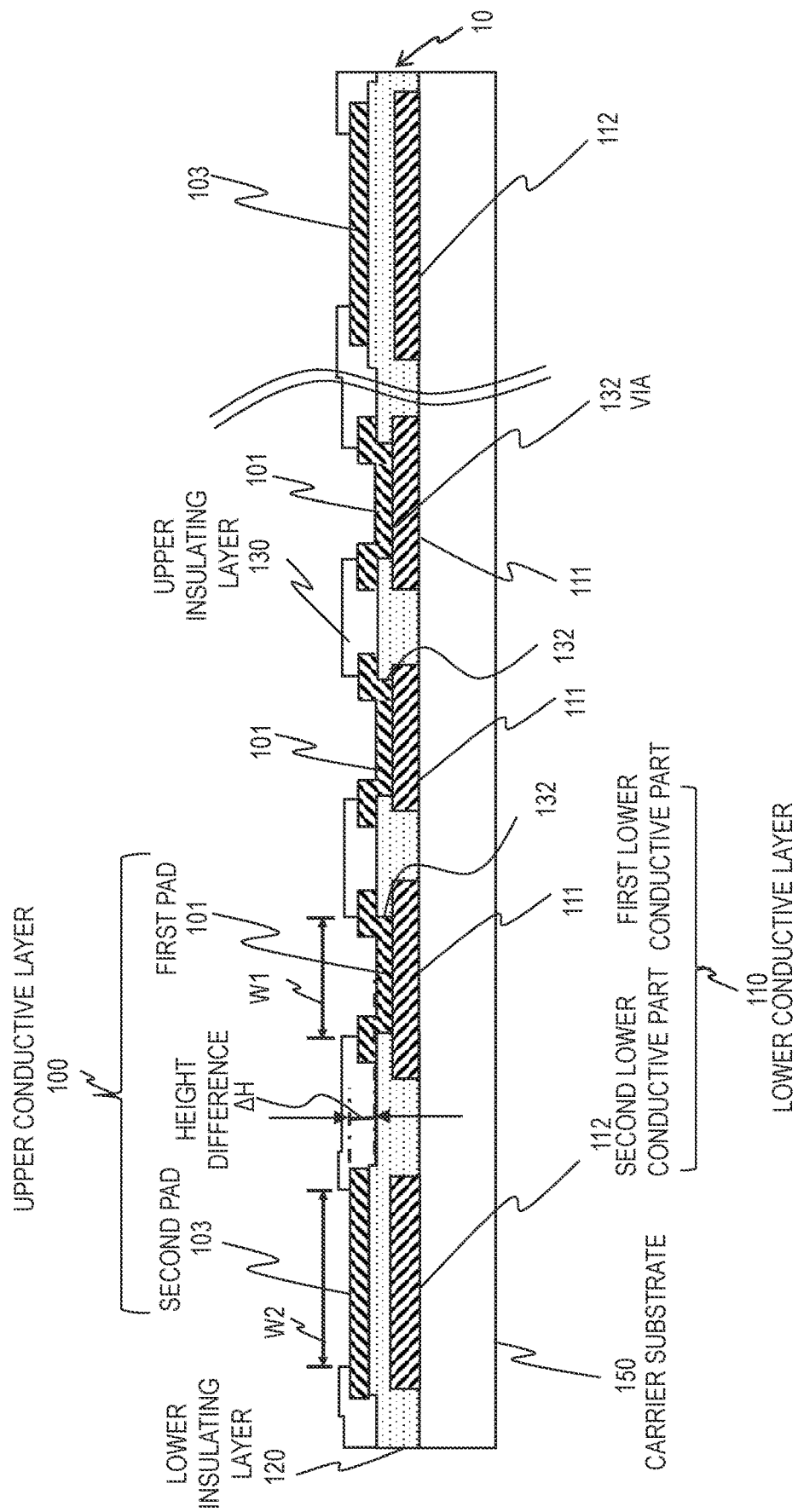
FIG. 1B schematically illustrates a cross-sectional structure along the section line IB-IB in FIG. 1A.

FIG. 1B schematically illustrates a cross-sectional structure along the section line IB-IB in FIG. 1A. FIG. 1B illustrates a cross-sectional structure of the multi-layered board 10 on a carrier substrate 150. The carrier substrate 150 can be a glass substrate. The multi-layered board 10 is detached from the carrier substrate 150 after the semiconductor chip is bonded.

In the configuration example of FIG. 1B, the multi-layered board 10 includes a lower conductive layer 110, a lower insulating layer 120, an upper conductive layer 100, and an upper insulating layer 130 layered in this order from the bottom (the layer closest to the carrier substrate 150). A release layer not shown in FIG. 1B is provided between the lower conductive layer 110 and the carrier substrate 150. Another insulating layer and another conductive layer can be provided under the configuration example of FIG. 11B, between the lower conductive layer 110 and the carrier substrate 150. The material for the conductive layers and the insulating layers can be selected desirably; for example, copper can be used as conductive material and polyimide can be used as insulating material.

The lower conductive layer 110 includes a plurality of first lower conductive parts 111 and a plurality of second lower conductive parts 112. In the configuration example of FIG. 1B, the conductive parts 111 and 112 are distant from one another. The lower insulating layer 120 is provided to be in direct contact with and cover the lower conductive layer 110 (partially). The lower insulating layer 120 fills the space between lower conductive parts.

The lower insulating layer 120 has a plurality of holes (openings). When viewed planarly (when viewed in the layering direction), the first lower conductive parts 111 are partially located within the holes. In other words, each first lower conductive part 111 is partially exposed in a hole of the lower insulating layer 120. As will be described later, the first lower conductive part 111 in the hole of the lower insulating layer 120 is completely covered with a first pad 101.

The upper conductive layer 100 includes first pads 101 and second pads 103. The upper insulating layer 130 is provided to be in direct contact with and cover the upper conductive layer 100 (partially). As described with reference to FIG. 1A, the pads are the parts of the upper conductive parts exposed in the holes of the upper insulating layer 130. The upper insulating layer 130 is partially in direct contact with the lower insulating layer 120.

A via 132, which is a part of a first pad 101, is located in a hole opened through the lower insulating layer 120 and is in direct contact with a first lower conductive part 111 within the hole. As understood from this description, the first pad 101 is electrically connected with the first lower conductive part 111 therebeneath. Although the first pad 101 in the example of FIG. 1B is partially located above the lower insulating layer 120, the first pad can consist of only a via.

When viewed planarly, the hole of the upper insulating layer 130 to expose a first pad 101 at least has an overlap with the hole of the lower insulating layer 120 where a part of a first lower conductive part 111 is located. The part of the first lower conductive part 111 is located directly beneath the first pad 101 and is in direct contact with the via 132.

At least a part of a second lower conductive part 112 is located directly beneath a second pad 103. The lower insulating layer 120 is interposed between the second lower conductive part 112 and the second pad 103; the second pad 103 and the second lower conductive part 112 are distant in the layering direction.

In the configuration example of FIG. 1B, a first pad 101 is located above a first lower conductive part 111 in a hole of the lower insulating layer 120 and a second pad 103 is located above the lower insulating layer 120. The upper conductive layer 100 has a substantially uniform thickness. The top surface of the first pad 101 is located lower than the top surface of the second pad 103.

The height of the top surface of a pad is defined as the height at the centroid of the pad. FIG. 1B provides the difference ΔH in the height of the top surface between a first pad and a second pad. In the configuration example of FIG. 1B, the lowest point in the top surface of a first pad 101 is lower than the lowest point in the top surface of a second pad 103. As will be described later, the configuration such that the top surface of the first pad 101 is located lower than the top surface of the second pad 103 enables appropriate self-alignment of the solder bumps on a semiconductor chip in the reflow process.

The structure of the configuration example of FIG. 1B such that each second lower conductive part 112 is located directly beneath a second pad 103 or each second lower conducive part 112 overlaps a second pad 103 when viewed planarly facilitates generation of the necessary height difference ΔH. In another configuration example, the conductive parts of the lower conductive layer 110 do not need to be provided directly beneath the second pads 103 if formation of a lower insulating layer 120 having the necessary height difference ΔH is available.

In the configuration example of FIGS. 1A and 1B, the width W2 of the second pads 103 is larger than the width W1 of the first pads 101. The pads 101 and 103 in this configuration example have circular shapes and accordingly, their widths are the diameters.

Figure 1C:
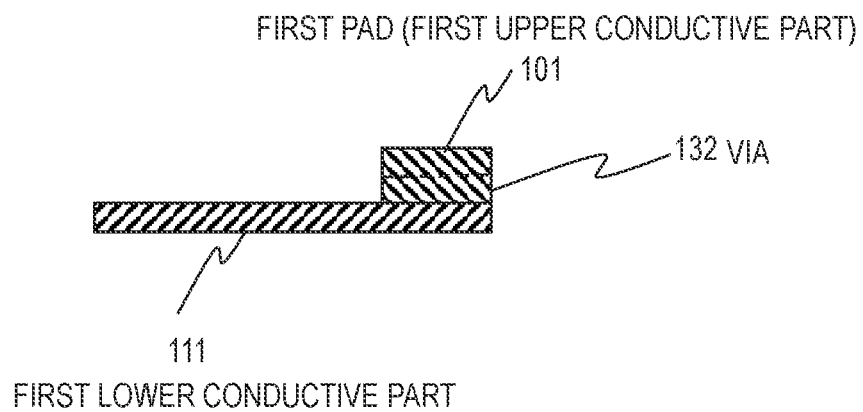
FIG. 1C schematically illustrates a cross-sectional structure along the section line IC-IC in FIG. 1A.

FIG. 1C schematically illustrates a cross-sectional structure along the section line IC-IC in FIG. 1A. The first pad 101 is a first upper conductive part of the upper conductive layer or a part of it. As described with reference to FIG. 1B, the first pad 101 includes a via 132. A first lower conductor part 111 is located directly beneath the first pad 101 and the via 132 is in direct contact (directly connected) with the first lower conductive part 111. The first lower conductive part 111 extends outward from the contact area with the via 132.

Figure 1D:
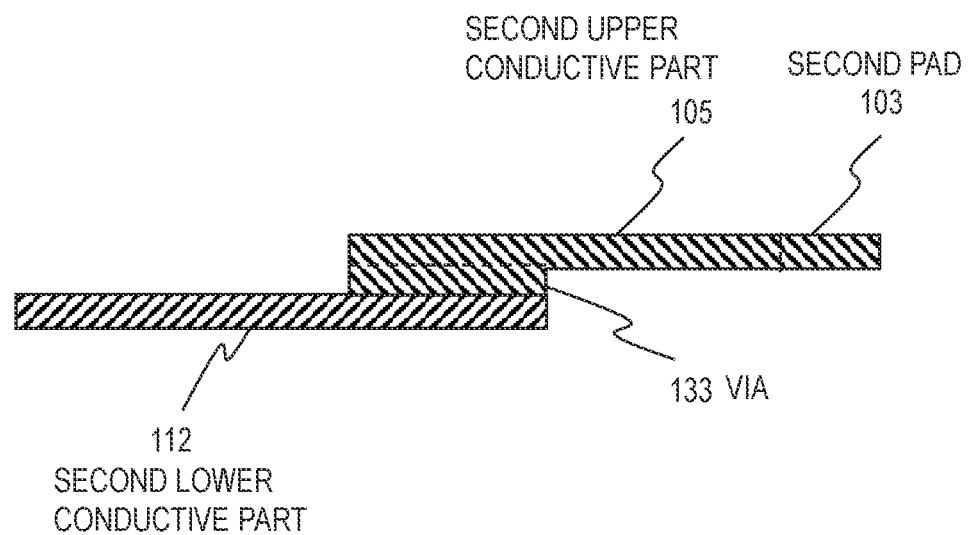
FIG. 1D schematically illustrates a cross-sectional structure along the section line ID-ID in FIG. 1A.

FIG. 1D schematically illustrates a cross-sectional structure along the section line ID-ID in FIG. 1A. The second pad 103 is a part of a second upper conductive part 105 of the upper conductive layer. The second upper conductive part 105 includes a via 133 in an area different from the pad 103. The via 133 is provided through a hole of the lower insulating layer 120 shown in FIGS. 1B and 1s in direct contact with the second lower conductive part 112. The second lower conductive part 112 extends outward from the contact area with the via 133.

Figure 2:
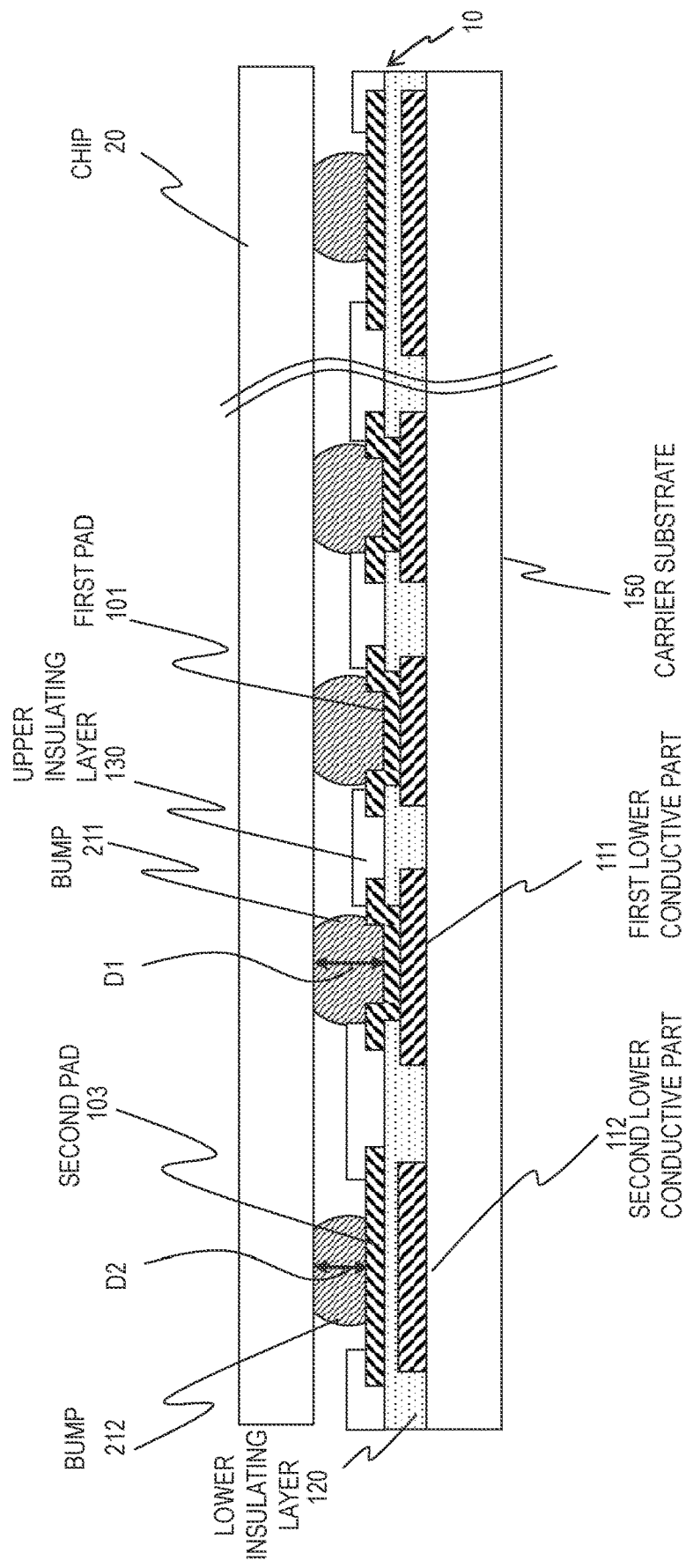
FIG. 2 is a cross-sectional diagram schematically illustrating a chip soldered to the multi-layered board.

FIG. 2 is a cross-sectional diagram schematically illustrating a chip 20 soldered with the multi-layered board 10. The chip 20 and the multi-layered board 10 are bonded together with a bump array. The bumps are made of solder. As will be described later, the solder bump array is provided on one side of the chip 20 and the bump array of the chip 20 is reflowed to bond with the pads 101 and 103 of the multi-layered board 10.

In the configuration example of FIG. 2, the first pads 101 bond with bumps (first solder bumps) 211 and the second pads 103 bond with bumps (second solder bumps) 212. In FIG. 2, one of the bumps bonding with a first pad 101 is provided with a reference sign 211 by way of example. Further, one of the bumps bonding with a second pad 103 is provided with a reference sign 212 by way of example.

After the reflow process, the thickness D2 of the bumps 212 is smaller than the thickness D1 of the bumps 211. The thickness of a bump is defined as the distance from the top surface of the pad to the main face of the chip 20. This difference in the thickness of the bump is caused by the difference in the height of the top surface between the first pads 101 and the second pads 103. In this configuration example, the bumps 211 and 212 before the reflow process have the same shape (including the size). The bumps before the reflow process having the same shape enable efficient fabrication of a bump array on the chip 20.

In the configuration example of FIG. 2, the bumps 211 and 212 are made of solder only. In another configuration example, a bump can consist of a pillar and a solder tip at the end of the pillar. The pillar is typically made of copper. In still another example, the bumps 211 can have a different shape from the shape of the bumps 212; for example, the bumps 212 can have a width larger than the width of the bumps 211. When the width of bump is not constant, the smallest value can be taken as a reference.

Reflow Soldering

Figure 3A:
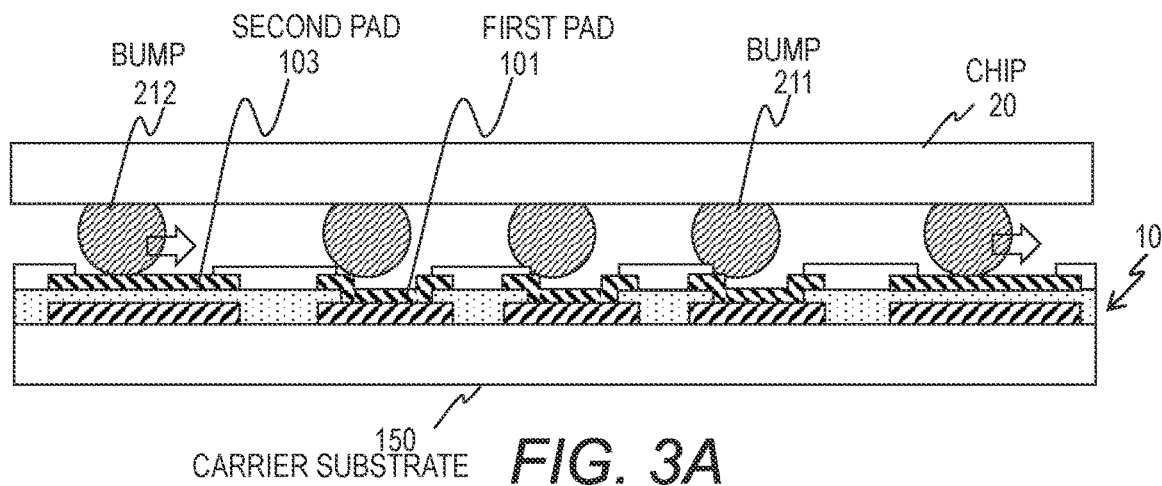
FIG. 3A is a schematic diagram for illustrating self-alignment of a chip caused by reflow of solder bumps.
Figure 3B:
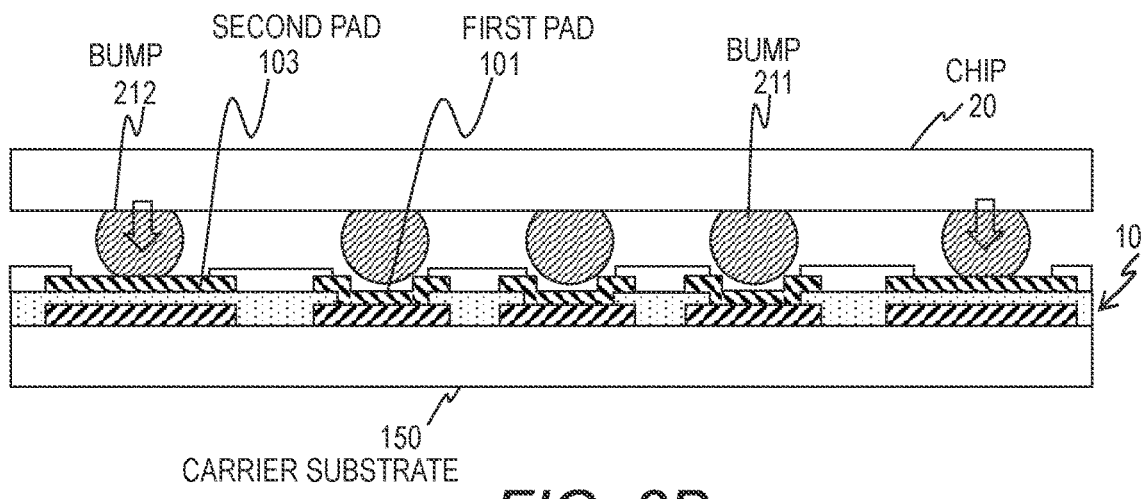
FIG. 3B is a schematic diagram for illustrating self-alignment of a chip caused by reflow of solder bumps.
Figure 3C:
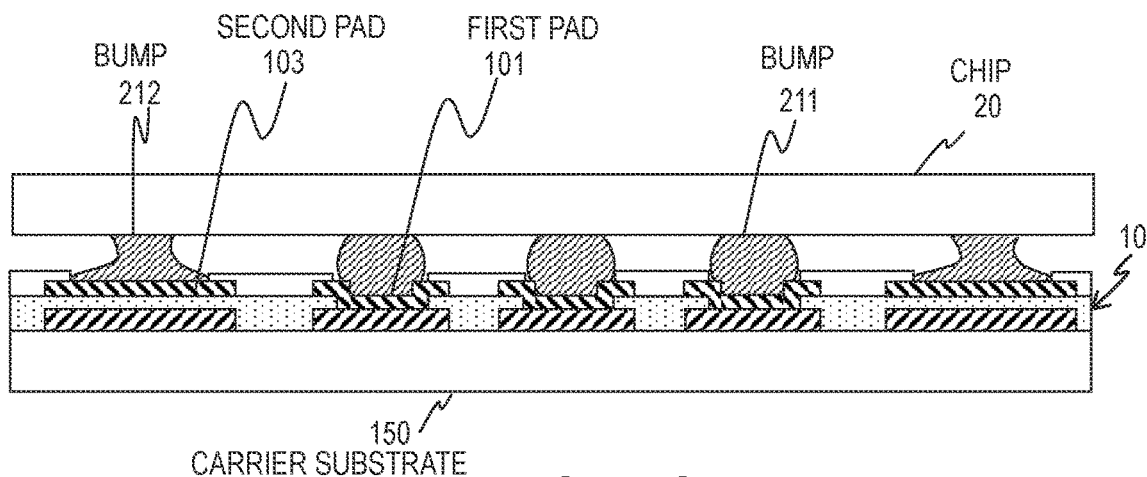
FIG. 3C is a schematic diagram for illustrating self-alignment of a chip caused by reflow of solder bumps.

Self-alignment (self-adjustment of the mounting position) of a chip caused by reflow of solder bumps is described. FIGS. 3A, 3B, and 3C are schematic diagrams for illustrating the self-alignment of a chip caused by reflow of solder bumps. One of the components of each kind is provided with a reference sign by way of example.

Reflow soldering has effect of self-alignment of the bumps with the pads. The self-alignment effect is induced by the surface tension of the molten solder. Even if the chip is initially misaligned with respect to the multi-layered board, the mounting position of the chip is automatically corrected by the self-alignment effect as far as the deviation of the bumps with respect to the pads is in a tolerable range. As a result, the chip 20 is bonded to the multi-layered board 10 more accurately than when the chip 20 is initially placed.

FIG. 3A schematically illustrates a chip 20 at the initial position with respect to the multi-layered board 10 as placed and surface tension generated by reflow of solder bumps. Bumps 211 and 212 are arrayed on one side of the chip 20 in advance. The chip 20 is placed on the multi-layered board 10 in such a manner that the side of the chip 20 with the bumps 211 and 212 faces the side of the multi-layered board 10 with pads 101 and 103.

In FIG. 3A, the chip 20 is misaligned from the proper position leftward with respect to the multi-layered board 10. The top surfaces of the second pads 103 are located higher than the top surfaces of the first pads 101. Accordingly, in placing the chip 20 onto the multi-layered board 10, the bumps 212 first contact the surfaces of the second pads 103. At this time, the bumps 211 have not contacted the first pads 101 yet.

In response to being heated, the bumps 212 melt to generate surface tension. Even though the bumps 212 are initially misaligned with the second pads 103, the position of the chip 20 with respect to the multi-layered board 10 is corrected by the surface tension of the molten bumps 212. In the example of FIG. 3A, the surface tension acts to move the chip 20 from the left to the right.

The first pads 101 in FIG. 3A look as if they are in contact with the bumps at their ends; actually, however, they are distant or even if they are in contact, the contact area is very small. Accordingly, the molten solder does not spread over the first pads 101.

FIG. 3B illustrates the chip 20 located at a position corrected by the self-alignment. Because of the self-alignment effect with the second pads 103, the bumps 211 to mate with the first pads 101 are also repositioned. Further, the solder bumps 212 on the second pads 103 liquefy to lower the chip 20, so that the first pads 101 also get contact with the solder bumps 211.

FIG. 3C schematically illustrates the multi-layered board 10 and the chip 20 after the reflow process is complete. As being heated in the reflow process, the solder of the bumps to mate with the first pads also melts and spreads over the pads at the corrected position and the reflow soldering is completed.

As described above, the chip 20 is repositioned by self-alignment with the multi-layered board 10 because of the surface tensions of the molten bumps 212 on the second pads 103. Since the force of self-alignment is generated on the second pads disposed appropriately for the self-alignment, the chip 20 can be appropriately aligned with the multi-layered board 10 without precise initial positioning. Further, the bumps 212 bonding with the second pads 103 absorb the load caused by the difference in thermal expansion between the multi-layered board 10 and the chip 20; the reliability of connection of the solder bumps is increased.

Moreover, the second pads 103 having a larger area than the first pads 101 enable a chip with narrow-pitch bumps to be repositioned correctly by self-alignment even if the deviation of the chip 20 at the initial position is large.

As described above, the second pads 103 and the bumps 212 are used for alignment of the chip 20 with the multi-layered board 10. Accordingly, the bumps 211 can be signal terminals of the chip 20 whereas the bumps 212 are not signal terminals but used only to align the chip 20 with the multi-layered board 10. The bumps 212 can be signal terminal.

Manufacture of Multi-Layered Board

Hereinafter, a method of manufacturing a multi-layered board 10 is described. First, the outline of the manufacture of a multi-layered board 10 is described with reference to FIGS. 4A to 4E. FIGS. 4A to 4E each illustrate a step of manufacturing a multi-layered board 10.

Figure 4A:
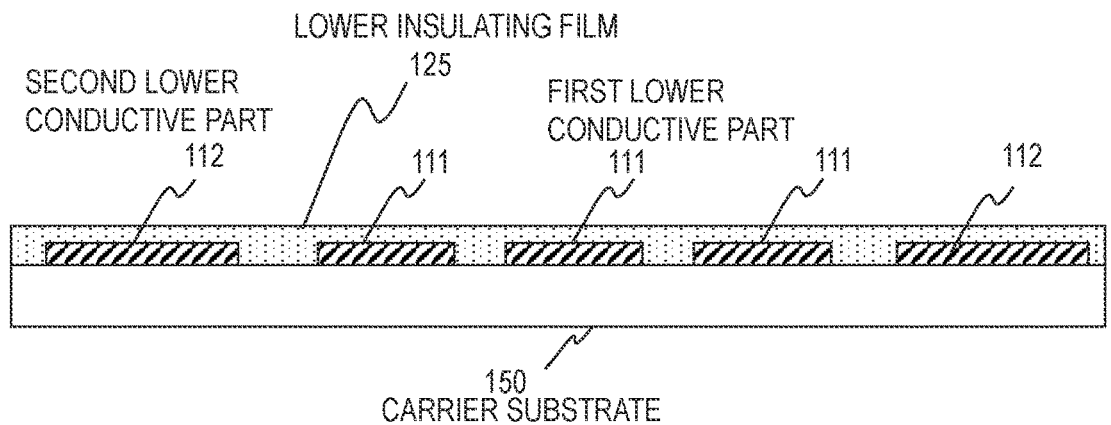
FIG. 4A illustrates a step of manufacturing a multi-layered board.

With reference to FIG. 4A, the manufacture produces a lower conductive layer including first lower conductive parts 111 and second lower conductive parts 112 on a glass substrate as a carrier substrate 150. An example of the formation of the lower conductive layer forms first lower conductive parts 111 and second lower conductive parts 112 by plating a patterned seed layer. Further, the manufacture produces a lower insulating film 125 to cover the whole area of the carrier substrate 150 with the lower conductive layer thereon.

Figure 4B:
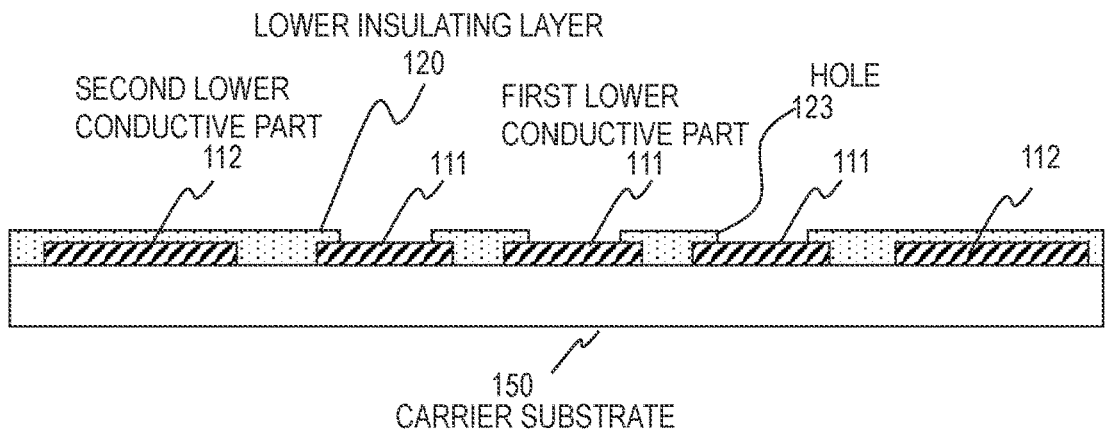
FIG. 4B illustrates a step of manufacturing a multi-layered board.

Next with reference to FIG. 4B, the manufacture opens holes (openings) including holes 123 in the lower insulating film 125 to form a lower insulating layer 120. The holes can be opened by exposing and developing the lower insulating film 125 with a mask. In FIG. 4B, one of the holes is provided with a reference sign 123 by way of example. Each first lower conductive part 111 is partially exposed from a hole 123 to the external. As described with reference to FIG. 1D, each second lower conductive part 112 is partially exposed from a hole different from the holes 123.

Figure 4C:
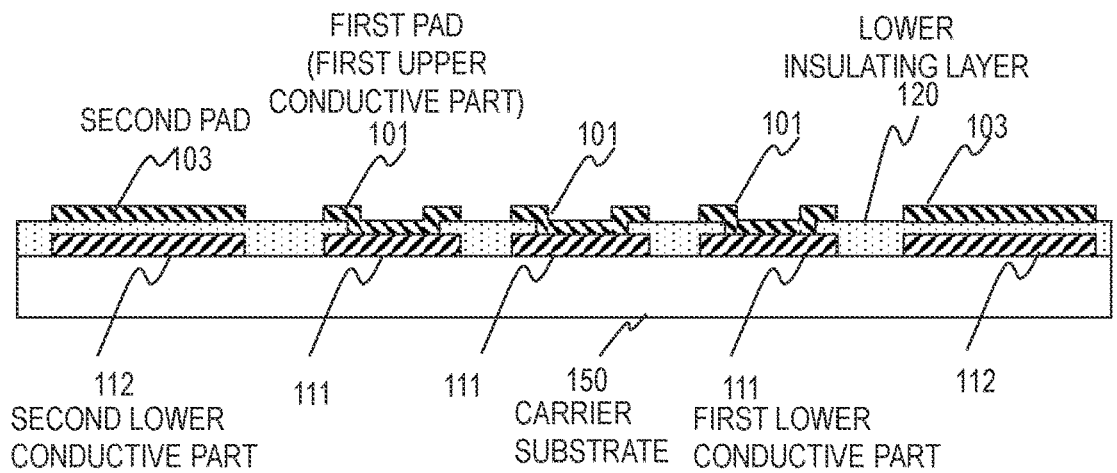
FIG. 4C illustrates a step of manufacturing a multi-layered board.

Next with reference to FIG. 4C, the manufacture produces an upper conductive layer including first pads 101 and second pads 103. A first pad 101 is all or a part of a first upper conductive part and a second pad 103 is all or a part of a second upper conductive part. The second pad 103 in the configuration example of FIG. 1D is a part of a second upper conductive part. An example of the formation of the upper conductive layer forms the first upper conductive parts and the second upper conductive parts by plating a patterned seed layer.

Each first pad 101 is in direct contact with a first lower conductive part 111 in a hole 123 of the lower insulating layer 120. The main part of the first pad 101 except for the outer end is formed within the hole 123. Each second pad 103 is formed above the lower insulating layer 120. As a result, the top surfaces of the first pads 101 are located lower than the top surfaces of the second pads 103.

Figure 4D:
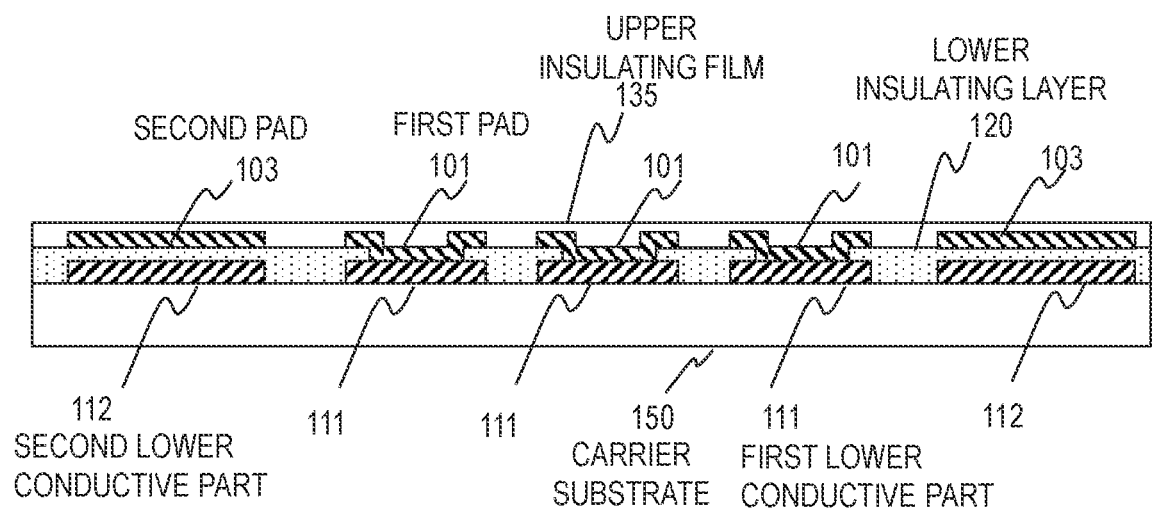
FIG. 4D illustrates a step of manufacturing a multi-layered board.
Figure 4E:
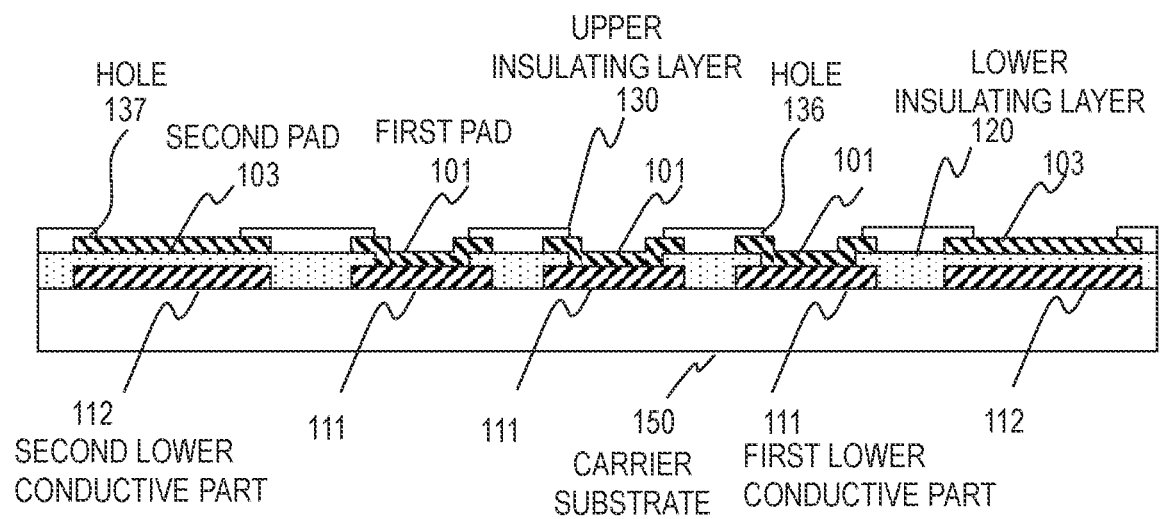
FIG. 4E illustrates a step of manufacturing a multi-layered board.

Next with reference to FIG. 4D, the manufacture produces an upper insulating film 135 to cover the whole area of the carrier substrate 150 with the upper conductive layer thereon. Next with reference to FIG. 4E, the manufacture opens holes including holes 136 and 137 in the upper insulating film 135 to form an upper insulating layer 130. The holes can be opened by exposing and developing the upper insulating film 135 with a mask. The holes 136 are to expose the first pads 101 and the holes 137 are to expose the second pads 103. In FIG. 4E, one of the holes to expose a first pad 101 is provided with a reference sign 136 by way of example and one of the holes to expose a second pad 103 is provided with a reference sign 137 by way of example.

Figure 5A:
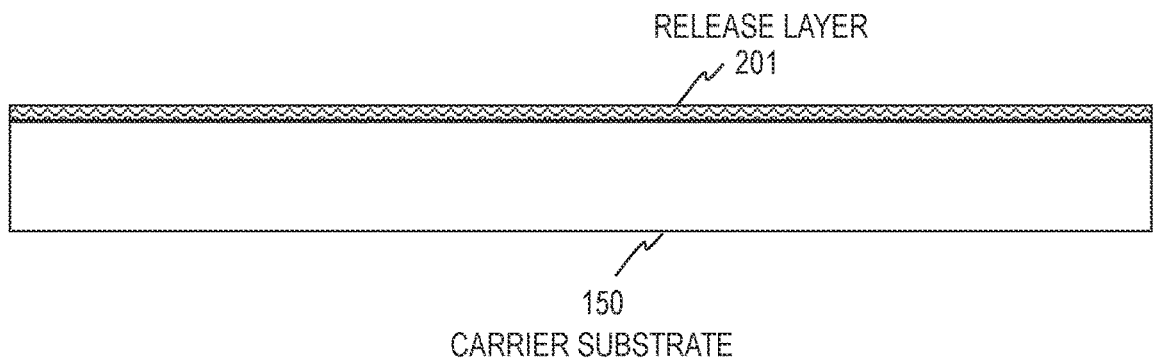
FIG. 5A illustrates a step of manufacturing a multi-layered board.

Next, a method of forming the insulating layers and the conductive layers of the multi-layered board 10 is described more specifically. FIGS. 5A to 5K each illustrate a step of manufacturing a multi-layered board 10. With reference to FIG. 5A, the manufacture deposits a release layer 201 by slit coating on a glass carrier substrate 150 and bakes it. The purpose of the release layer 201 is to detach a semiconductor package from the carrier substrate 150 after the semiconductor package is made up.

Figure 5B:
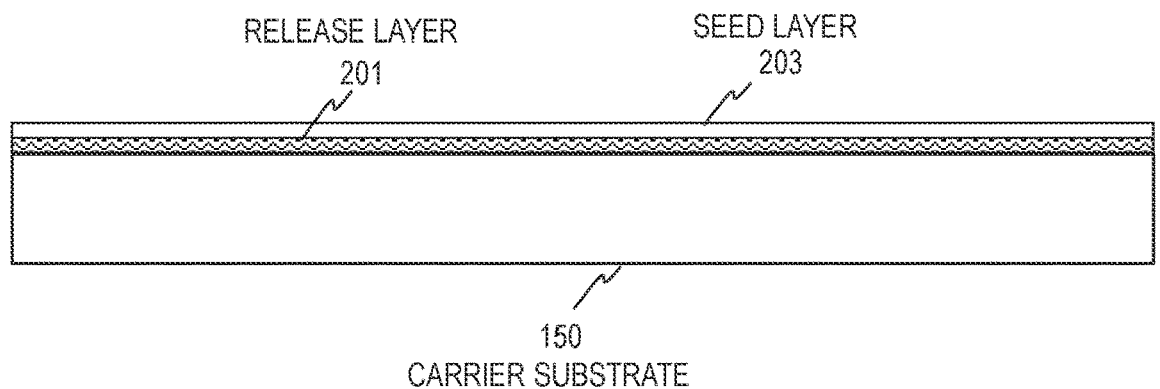
FIG. 5B illustrates a step of manufacturing a multi-layered board.

Next with reference to FIG. 5B, the manufacture deposits a copper seed layer 203 on the whole area of the release layer 201 (carrier substrate 150) by sputtering in order to deposit a copper plate later. Next with reference to FIG. 5C, the manufacture applies photosensitive resist to the substrate 150, exposes the substrate 150 with a mask to light, and develops it for the subsequent copper plating. As a result, a resist pattern 205 is formed.

Figure 5C:
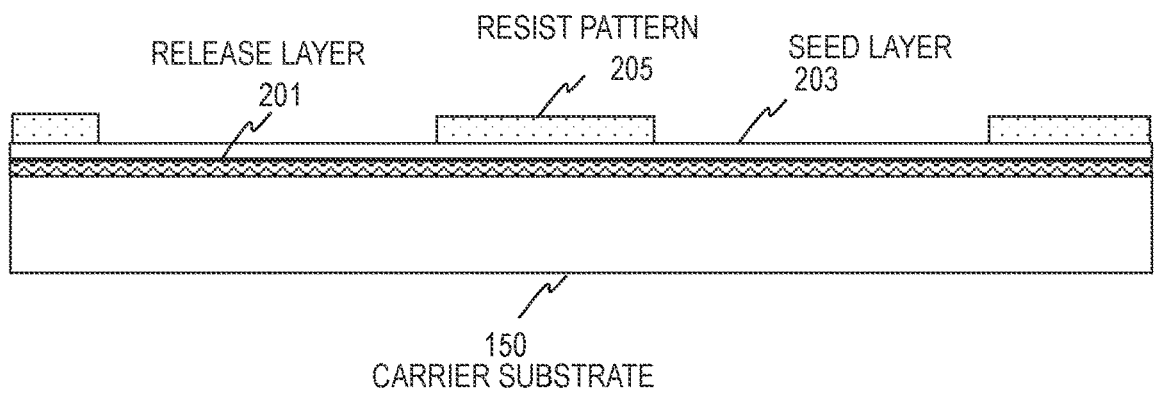
FIG. 5C illustrates a step of manufacturing a multi-layered board.
Figure 5D:
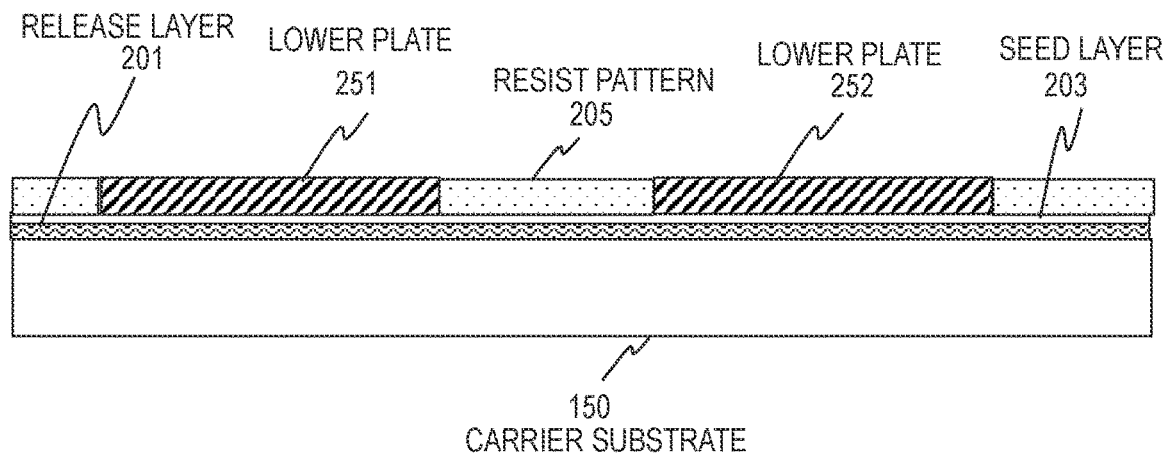
FIG. 5D illustrates a step of manufacturing a multi-layered board.

Next with reference to FIG. 5D, the manufacture deposits copper by electrolytic plating. As a result, lower plates 251 and 252 are formed on the seed layer 203 within the holes of the resist pattern 205. Next, with reference to FIG. 5E, the manufacture detaches the resist pattern 205. As a result, the seed layer 203 is exposed only within the holes where the resist pattern 205 is removed.

Figure 5E:
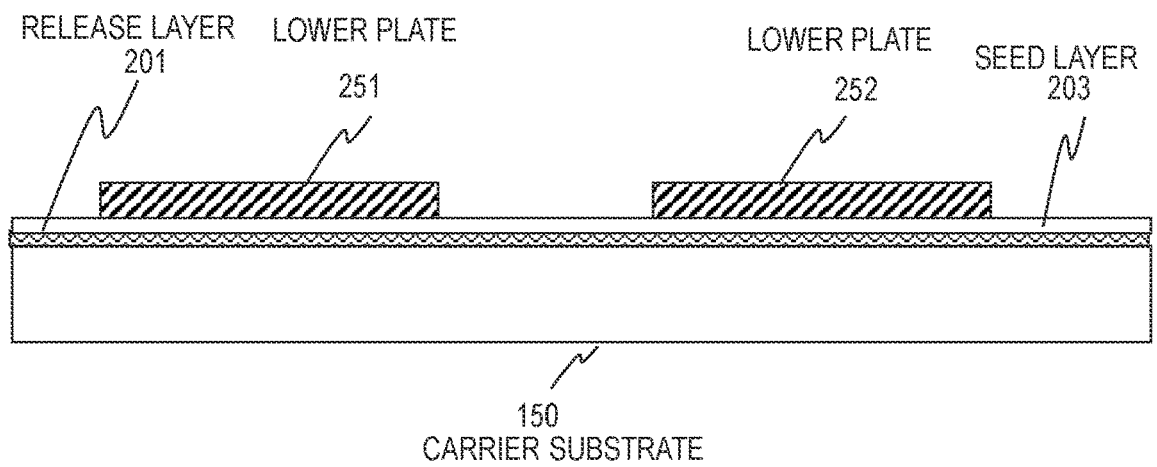
FIG. 5E illustrates a step of manufacturing a multi-layered board.
Figure 5F:
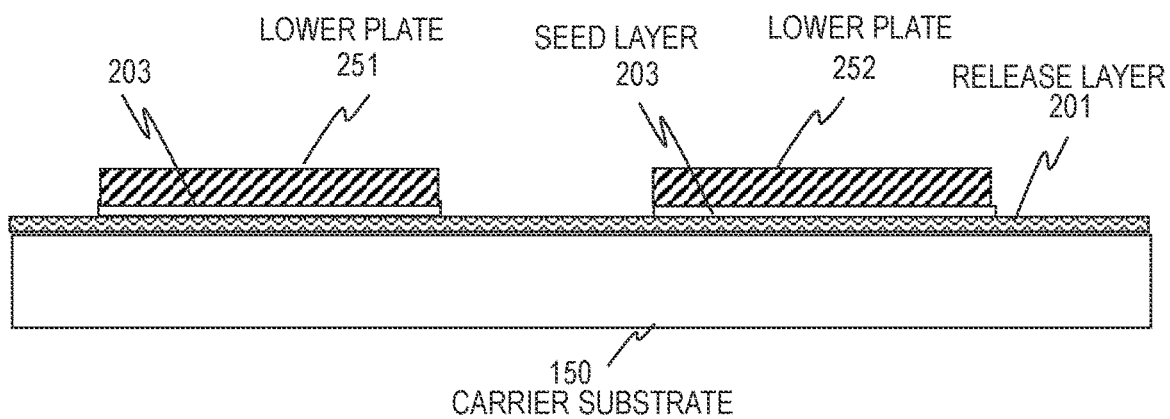
FIG. 5F illustrates a step of manufacturing a multi-layered board.

Next with reference to FIG. 5F, the manufacture removes the seed layer 203 by etching in the region except for the plated regions. Wet etching using an etching solution can be selected. As a result, the seed layer 203 remains only in the parts under the lower plates 251 and 252. A lower plate 251 and the seed layer therebeneath constitute a lower conductive part and further, a lower plate 252 and the seed layer therebeneath constitute another lower conductive part.

Figure 5G:
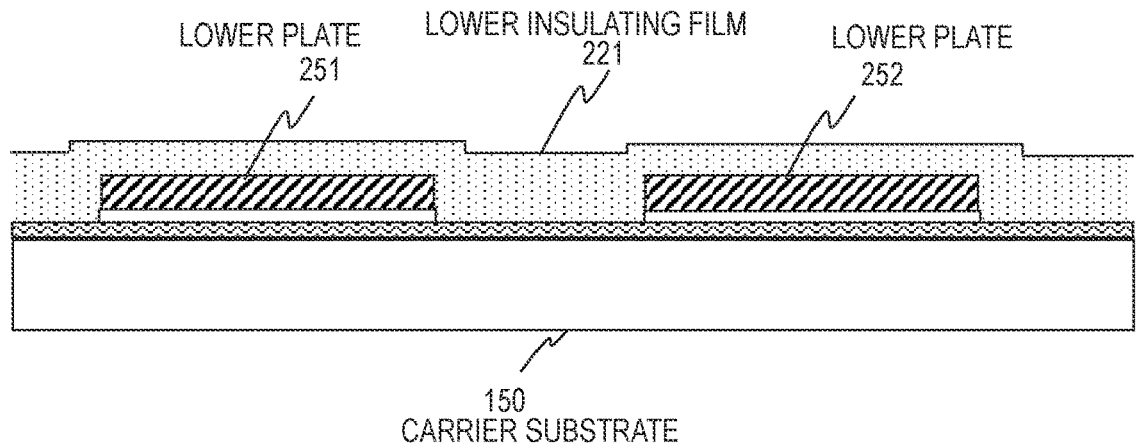
FIG. 5G illustrates a step of manufacturing a multi-layered board.

Next with reference to FIG. 5G, the manufacture applies insulating material to the whole area of the release layer 201 (carrier substrate 150) and bakes it to form a lower insulating film 221. An example of the insulating material is polyimide. The prepared lower insulating film 221 has small swellings above the lower plates 251 and 252 in accordance with their shapes.

For this reason, the second lower conductive parts 112 elevate the under surfaces of the second pads 103 with the lower insulating layer 120 interposed therebetween, as described with reference to FIG. 1B. As a result, the difference in the height of the top surface between the second pads 103 and the first pads 101 can be generated effectively. However, the following description of the subsequent manufacturing steps ignores the swellings of the lower insulating layer 120.

Figure 5H:
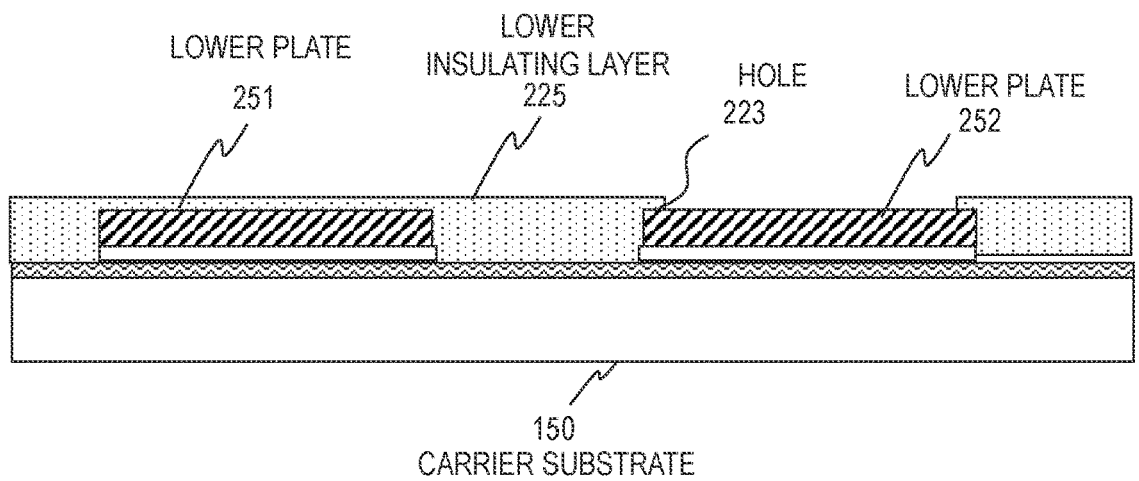
FIG. 5H illustrates a step of manufacturing a multi-layered board.

Next with reference to FIG. 5H, the manufacture exposes the lower insulating film 221 with a mask to light and develops it to open a plurality of holes including holes 223. As a result, a lower insulating layer 225 having a plurality of holes is formed. Each lower plate 252 is partially exposed from a hole 223 to the external. Each lower plate 251 can be partially exposed from a not-shown hole to the external.

Figure 5I:
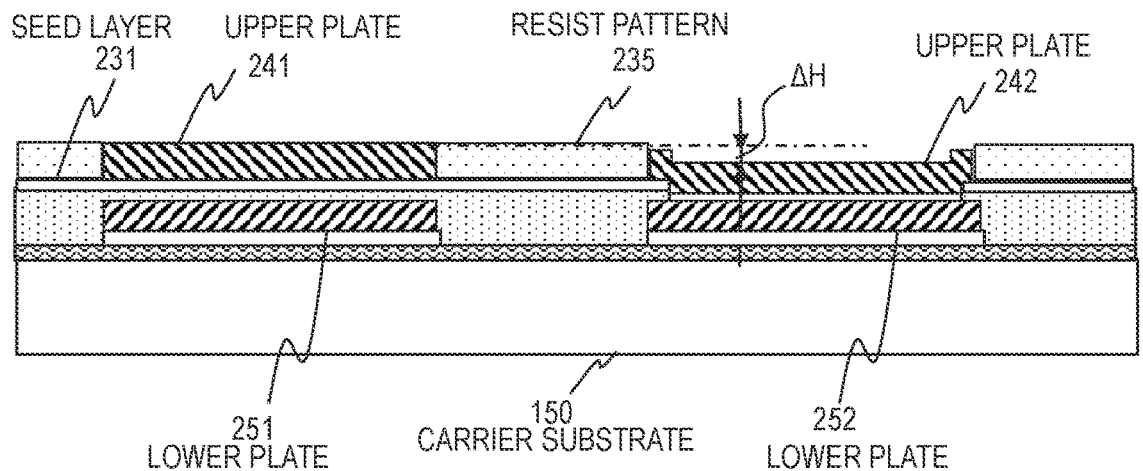
FIG. 5I illustrates a step of manufacturing a multi-layered board.

Next, with reference to FIG. 5I, the manufacture deposits a seed layer 231, forms a resist pattern 235 for plating, and produces upper plates 241 and 242 by electrolytic plating within the holes of the resist pattern 235 in the same way as described with reference to FIGS. 5B, 5C, and 5D. An upper plate 241 and the seed layer 231 therebeneath constitute an upper conductive part. A part of the upper plate 241 and the seed layer 231 therebeneath constitute a second pad 103 illustrated in FIG. 1B.

An upper plate 242 and the seed layer 231 therebeneath constitute another upper conductive part. A part of the upper plate 242 and the seed layer 231 therebeneath constitute a first pad 101 illustrated in FIG. 1B. The parts of the seed layer 231 and the upper plate 242 located within a hole 223 of the lower insulating layer 225 correspond to a via 132 to electrically connect to a lower conductive part 111 illustrated in FIG. 1B.

Electrolytic plating deposits copper in a substantially uniform thickness along the uneven base layer. Accordingly, the top surface of the part of the upper plate 242 corresponding to a first pad 101 in FIG. 5I is located lower than the top surface of the upper plate 241 and a height difference ΔH is generated. This corresponds to the height difference ΔH between the first pad 101 and the second pad 103 described with reference to FIG. 1B.

Figure 5J:
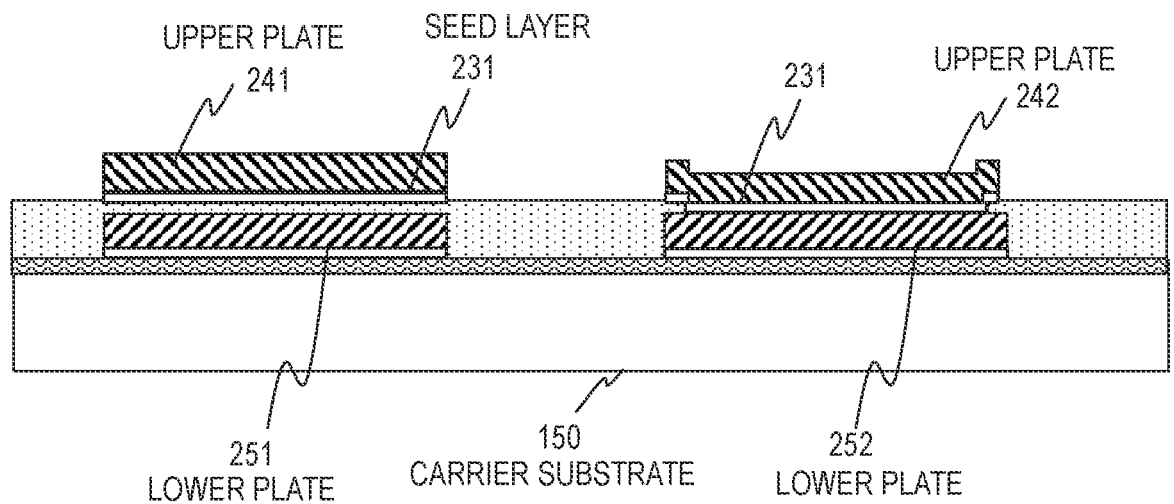
FIG. 5J illustrates a step of manufacturing a multi-layered board.

Next, with reference to FIG. 5J, the manufacture detaches the resist pattern 235 and removes the seed layer 231 by etching in the region except for the plated regions in the same way as described with reference to FIGS. 5E and 5F.

Figure 5K:
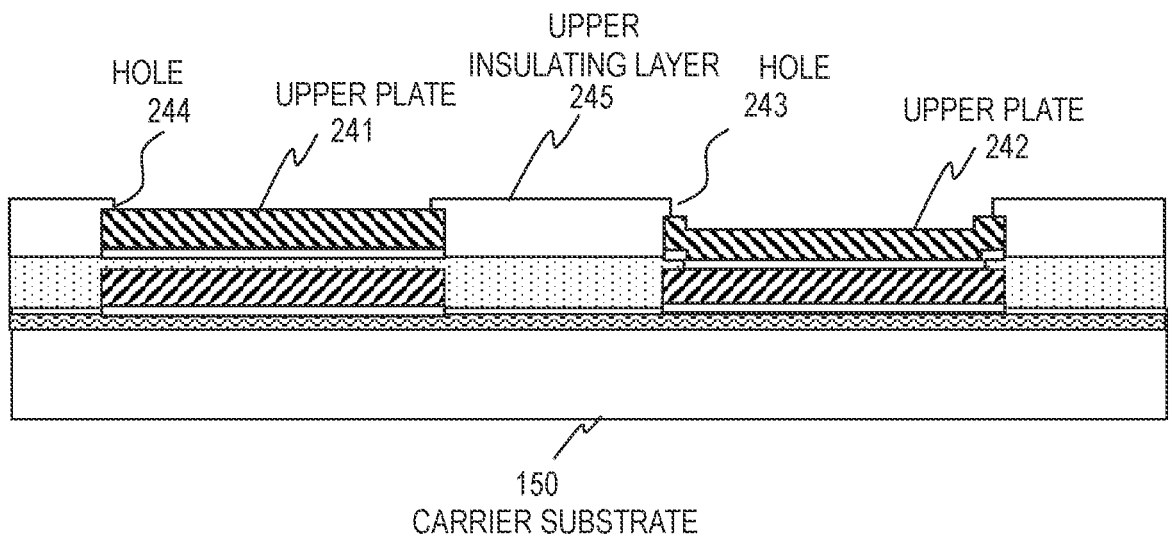
FIG. 5K illustrates a step of manufacturing a multi-layered board.

Next, with reference to FIG. 5K, the manufacture applies insulating material to the whole area of the carrier substrate 150 and bakes it to prepare an upper insulating film in the same way as described with reference to FIG. 5G. Further, the manufacture exposes the substrate 150 with a mask to light and develops it to open a plurality of holes including holes 243 and 244 in the same way as described with reference to FIG. 5H. As a result, a lower insulating layer 245 having a plurality of holes is prepared. The parts of the upper conductive parts exposed from the holes 243 correspond to first pads 101 and the parts of the upper conductive parts exposed from the holes 244 correspond to second pads 103.

In chip mounting, the manufacture places a semiconductor chip 20 on the multi-layered board 10 and finishes soldering by reflow process. To attain self-alignment effect depending on the height difference between the first pad and the second pad, the manufacture of the multi-layered board 10 does not produce a via beneath a second pad 103 but produces a via 132 beneath the first pad 101.

Structure Example of Multi-Layered Board

Figure 6:
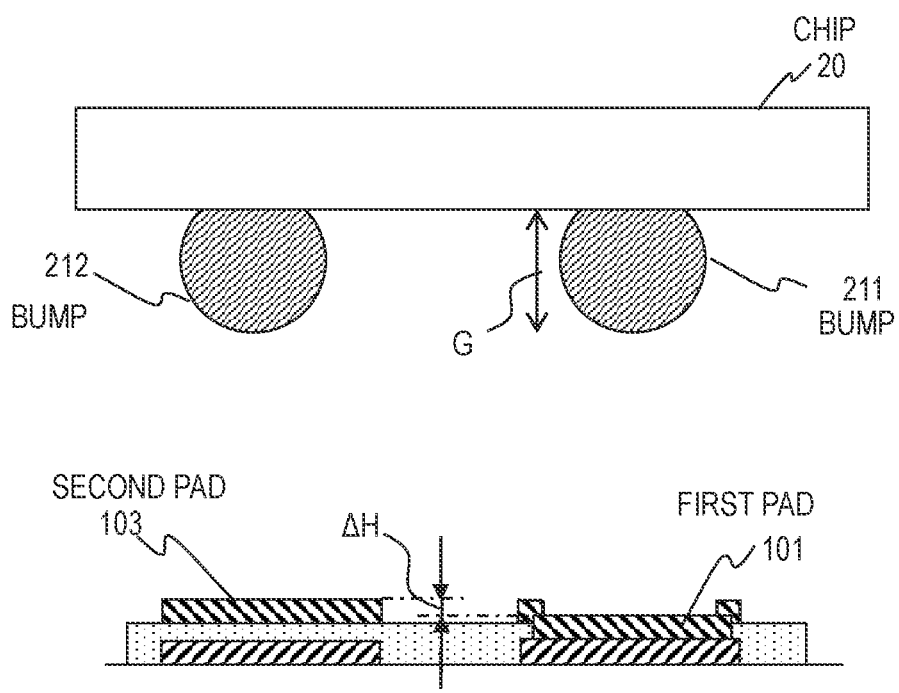
FIG. 6 illustrates the thickness G of a solder bump and the difference ΔH in the height of the top surface between a first pad and a second pad.

Hereinafter, a more specific structure of the multi-layered board 10 is described. FIG. 6 illustrates the thickness (height) G of a solder bump and the difference ΔH in the height of the top surface between a first pad 101 and a second pad 103. Each solder bump 211 in the configuration example of FIG. 6 is provided on the surface of the chip 20 without a pillar interposed therebetween. Accordingly, the distance from the surface of the chip 20 to the distal end of the solder bump 211 corresponds to the thickness of the solder bump. In the case where the solder bump is provided at the end of a pillar, the distance from the end of the pillar to the distal end of the solder bump corresponds to the thickness of the solder bump.

In an embodiment of this specification, the height difference ΔH is more than 0 and not more than 0.3G ($0 < \Delta H \leq 0.3G$). This configuration enables a solder bump 211 to bond with a first pad 101 more appropriately. If the height difference ΔH between the first pad and the second pad is too large with respect to the thickness G of the bump, the bump 211 cannot bond with the first pad 101 in the reflow process. For this reason, an example of the height difference ΔH between the pads is not more than 0.2G. For more appropriate self-alignment, the height difference ΔH between the pads can be not less than 0.1G.

Figure 7:
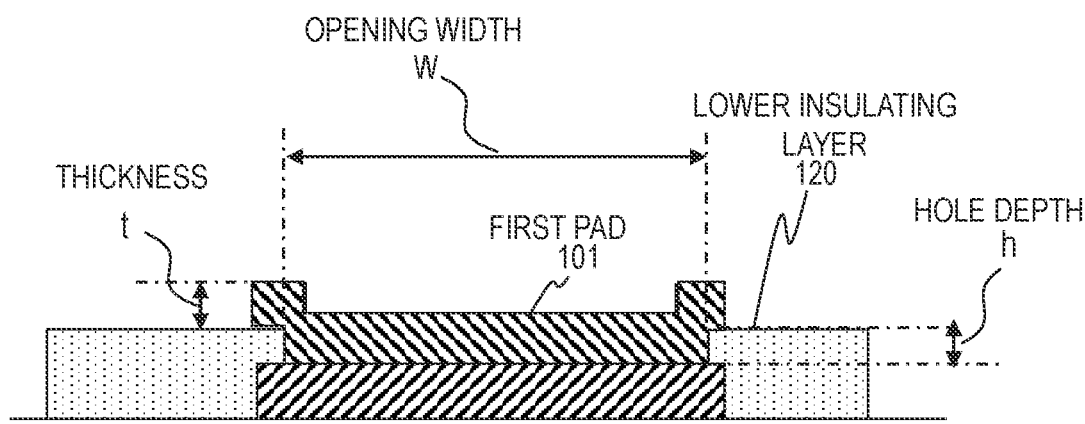
FIG. 7 illustrates the relation between the thickness t of a first pad and the width W of an opening of a lower insulating layer.

FIG. 7 illustrates the relation between the thickness t of a first pad 101 and the width (inner diameter) W of an opening of the lower insulating layer 120. The hole of the lower insulating layer 120 has a depth h. Compared to the plate, the seed layer has an extremely small thickness; therefore, the thickness t of the first pad 101 is substantially equal to the thickness of the plate. In an embodiment of this specification, the width W of the opening is twice or more as large as the thickness t of the pad ($W \geq 2t$). This relation generates the height difference ΔH between the first pad 101 and the second pad 103 more appropriately.

The height difference between pads is elaborately generated by the solder bumps, the pads, and the hole of the lower insulating layer satisfying the above-described specific relations and this height difference makes a time lag in working of the self-alignment by reflow soldering between the first pads and the second pads.

Figure 8A:
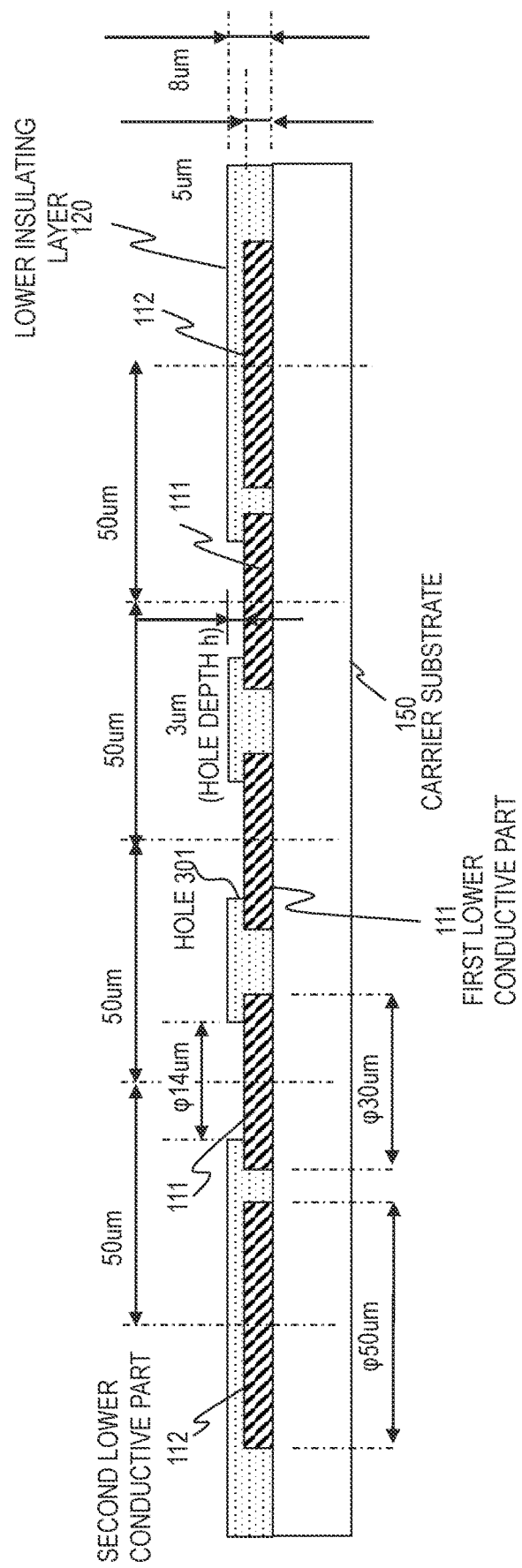
FIG. 8A provides examples of specific sizes of components of a multi-layered board.

In the following, specific numerical values satisfying the above-described conditions for the multi-layered board 10 are provided by way of example. FIG. 8A provides examples of specific sizes of lower conductor parts 111 and 112 and a lower insulating layer 120 fabricated on a carrier substrate 150. In an example, the plate thickness t of each layer is 5 μm and the thickness of each insulating layer is 8 μm. The depth h of the holes of the lower insulating layer 120 to expose the first lower conductive parts 111 is 3 μm.

Manufacture of the multi-layered board 10 produces second lower conductive parts 112 having a diameter φ of 50 μm and first lower conductive parts 111 having a diameter φ of 30 μm of the lower conductive layer at a pitch of 50 μm by plating and covers them with a lower insulating layer 120. Further, the manufacture opens via holes having a diameter φ of 14 μm in the lower insulating layer 120 at the locations above the first lower conductor parts 111. In FIG. 8A, only one of the holes is provided with a reference sign 301 by way of example. The pitch of the first lower conductive parts 111 and the second lower conductive parts 112 does not need to be even; for example, the pitch between a second lower conductive part 112 and a first lower conductive part 111 can be larger than the pitch between first lower conductive parts 111.

Figure 8B:
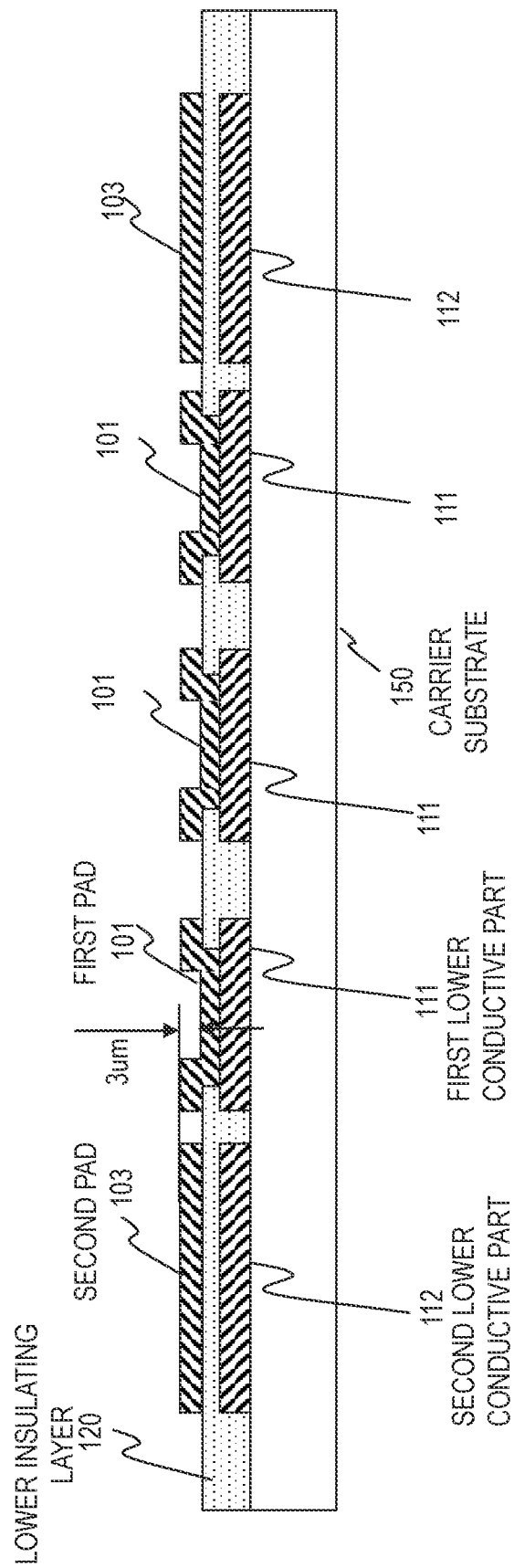
FIG. 8B provides examples of specific sizes of components of a multi-layered board.

As illustrated in FIG. 8B, the manufacture of the multi-layered board 10 produces first upper conductive parts each including a first pad 101 and second upper conductive parts each including a second pad 103 by plating in the same step. Although the upper conductive part and the lower conductive part laid one above the other in the example of FIG. 8B have the same width, they can have different widths.

The opening width W of the holes of the lower insulating layer 120 satisfies the condition $W \geq 2t$ (where t is the plate thickness). Each first pad 101 is formed along the depth h of a hole (the differences in level) of the lower insulating layer 120 and accordingly, the difference in the height of the top surface between the first pads 101 and the second pads 103 at this step is 3 μm (substantially equal to the hole depth h).

Figure 8C:
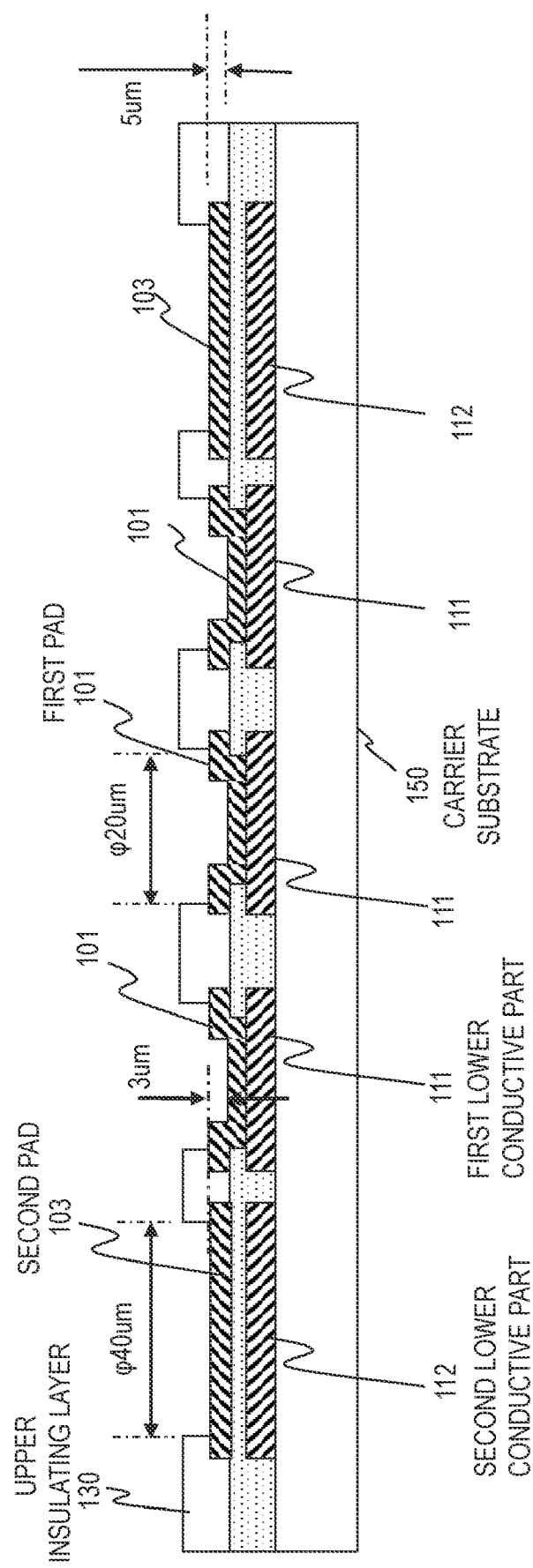
FIG. 8C provides examples of specific sizes of components of a multi-layered board.

As illustrated in FIG. 8C, the manufacture of the multi-layered board 10 produces an upper insulating layer 130 having a plurality of holes. The holes to expose first pads 101 have a diameter φ (opening width W) of 20 μm and the holes to expose second pads 103 have a diameter φ (opening width W) of 40 μm.

Figure 8D:
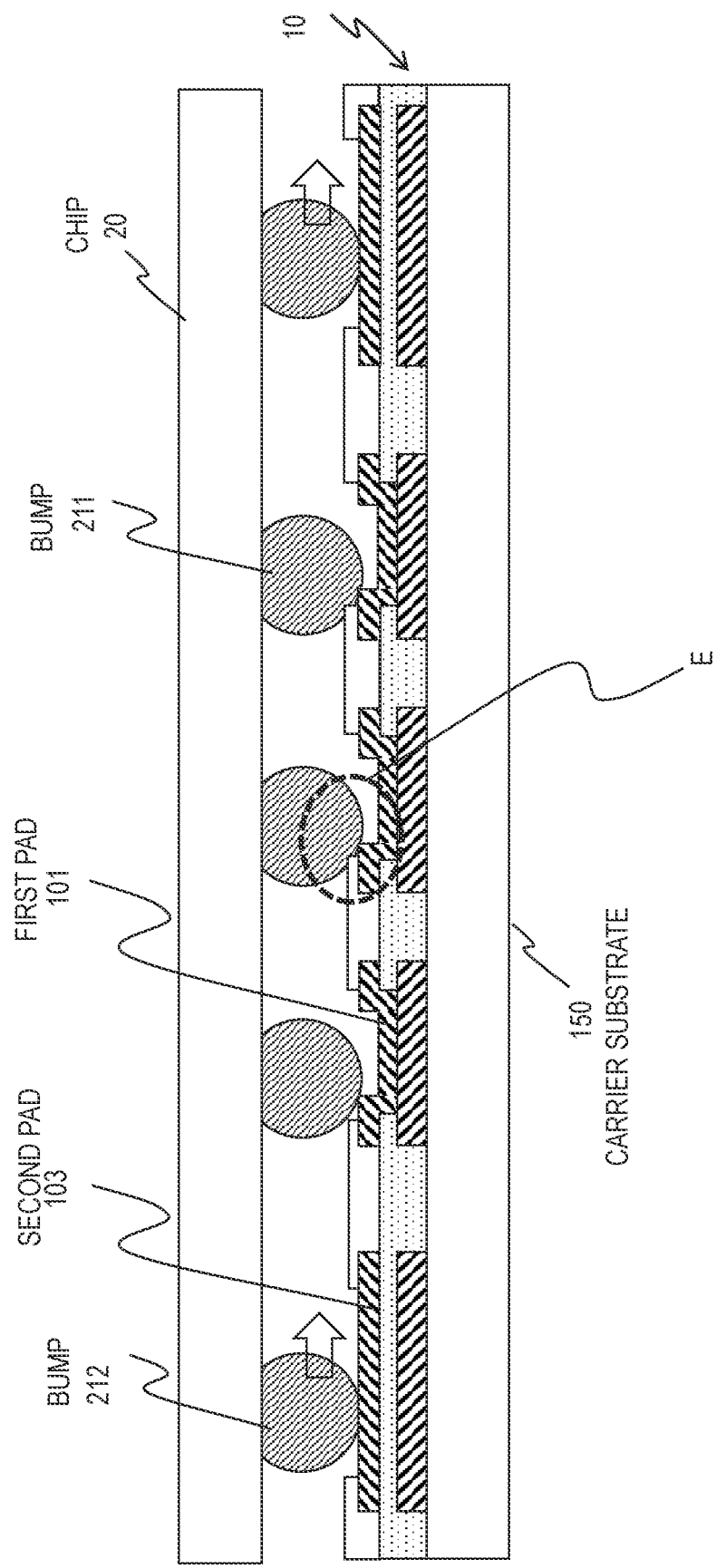
FIG. 8D illustrates a semiconductor chip at the initial position as placed on a multi-layered board.

FIG. 8D illustrates a chip 20 placed on the multi-layered board 10 to be soldered to. Assume that the solder bumps have a thickness G of 15 μm. There is a height difference ΔH of approximately 3 μm between the first pads 101 and the second pads 103. Since the thickness G of the solder bumps is 15 μm and the height difference ΔH is 3 μm, the relation ΔH≤0.3G is satisfied.

Accordingly, even if the chip 20 is initially misaligned with the multi-layered board 10, the second pads 103 first get in contact with the solder bumps 212 whereas the first pads 101 do not contact the solder bumps 211. Molten solder spreads over the second pads 103 only, so that its surface tension induces the self-alignment function.

Figure 8E:
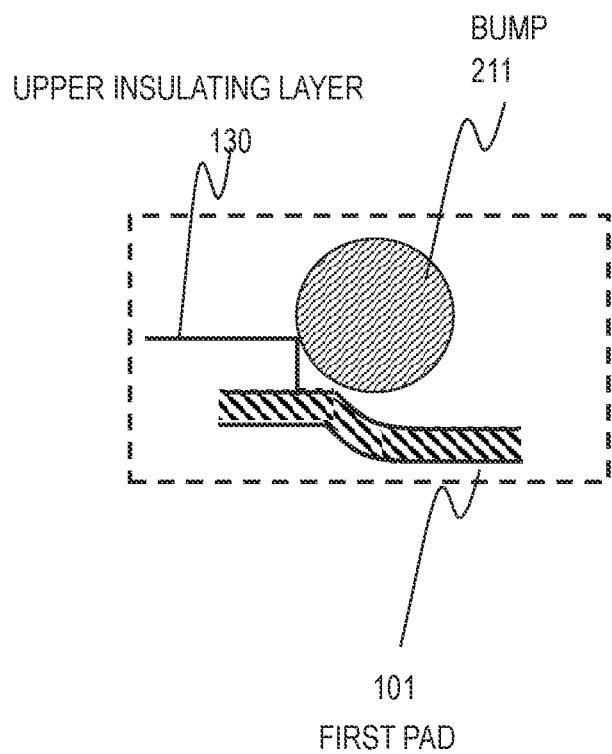
FIG. 8E illustrates the specifics of the part encircled by a dashed line E in FIG. 8D.

FIG. 8E illustrates the specifics of the part encircled by a dashed line E in FIG. 8D. Since the foregoing drawings illustrate the structures for convenience of the description, a first pad 101 is in contact with a solder bump 211 at the edge of a hole of the upper insulating layer 130. Actually, however, the first pad 101 is tapered and the solder bump 211 is not in contact with the first pad 101 or if it is, the molten solder does not spread over the first pad 101.

When solder melts and spreads over the second pads 103, the self-alignment effect is activated to correct the position of the chip 20 with respect to the multi-layered board 10. The maximum height difference between the first pads 101 and the second pads 103 to allow molten solder to spread is designed based on the condition that the thickness G of the bumps is 15 μm. Accordingly, the height difference ΔH of 3 μm between the first pads 101 and the second pads 103 satisfies the condition ΔH≤0.3G (=4.5 μm). Therefore, regardless of the height difference, the solder bumps 211 get in contact with and pressed by the first pads 101, so that the molten solder spreads over the first pads 101. Eventually, molten solder spreads over the first pads 101 and the self-alignment effect works to reposition the misaligned solder bumps to the proximity of the center of the first pads 101 to complete the reflow soldering.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A multi-layered board with a redistribution layer to mount a chip thereon by flip-chip bonding, the multi-layered board comprising:
   an upper insulating layer;
   a lower conductive layer located lower than the upper insulating layer and including a plurality of first lower conductive parts and a plurality of second lower conductive parts;
   an upper conductive layer located between the lower conductive layer and the upper insulating layer and including a plurality of first upper conductive parts and a plurality of second upper conductive parts; and
   a lower insulating layer located between the lower conductive layer and the upper conductive layer,
   wherein each of the plurality of first upper conductive parts includes a first pad exposed from a first hole of the upper insulating layer,
   wherein each of the plurality of second upper conductive parts includes a second pad exposed from a second hole of the upper insulating layer,
   wherein at least a part of the first pad is in direct contact with the respective first lower conductive part within a hole of the lower insulating layer,
   wherein the second pad is located outside and does not overlap any hole of the lower insulating layer and in direct contact with the lower insulating layer,
   wherein the second pad is separated from the respective second lower conductive part in a thickness direction of the second pad by the lower insulating layer interposed between the second pad and the respective second lower conductive part, and
   wherein a top surface of the second pad is located higher than a top surface of at least a part of the first pad.

2. The multi-layered board according to claim 1, wherein the second pad has a larger area than the first pad.

3. The multi-layered board according to claim 1, wherein the second pad is located on an outer end of an array of first pads and second pads.

4. The multi-layered board according to claim 1, wherein each of the plurality of second upper conductive parts is covered with the upper insulating layer in a part extending from the second pad and the part extending from the second pad is in contact with the respective second lower conductive part within a hole of the lower insulating layer.

5. The multi-layered board according to claim 1, wherein the hole of the lower insulating layer where the first pad is located has a width twice or more as large as a thickness of the first pad.

6. A semiconductor package comprising:
   a semiconductor chip;
   the multi-layered board according to claim 1; and
   solder bumps bonding one side of the semiconductor chip with first pads and second pads.

7. A method of manufacturing a semiconductor package, the method comprising:
   manufacturing a multi-layered board including a plurality of first pads and a plurality of second pads;
   preparing a chip including a plurality of first solder bumps and a plurality of second solder bumps;
   reflowing the plurality of second solder bumps in a state where the plurality of second solder bumps are in contact with the plurality of second pads;
   reflowing the plurality of first solder bumps in a state where the plurality of first solder bumps are in contact with the plurality of first pads after reflowing the plurality of second solder bumps;
   bonding the plurality of first solder bumps with the plurality of first pads; and
   bonding the plurality of second solder bumps with the plurality of second pads,
   wherein the manufacturing the multi-layered board includes:
      producing a lower conductive layer;
      producing a lower insulating layer above the lower conductive layer;
      producing an upper conductive layer above the lower insulating layer; and
      producing an upper insulating layer above the upper conductive layer, wherein the lower conductive layer includes a plurality of first lower conductive parts, wherein the upper conductive layer includes a plurality of first upper conductive parts and a plurality of second upper conductive parts, wherein each of the plurality of first upper conductive parts includes a first pad exposed from a first hole of the upper insulating layer, wherein each of the plurality of second upper conductive parts includes a second pad exposed from a second hole of the upper insulating layer, wherein at least a part of the first pad is in direct contact with the first lower conductive part within a hole of the lower insulating layer, wherein the second pad is located outside and does not overlap any hole of the lower insulating layer, and wherein a top surface of the second pad is located higher than a top surface of the first pad.

8. The method according to claim 7, wherein a difference $\Delta H$ in height between the top surface of the first pad and the top surface of the second pad and a height G of each of the plurality of first solder bumps satisfy the following relation: $0 < \Delta H \leq 0.3G$.

\* \* \* \* \*